United States Patent
Watanabe

Patent Number: 6,140,204
Date of Patent: Oct. 31, 2000

[54] PROCESS FOR PRODUCING A SEMICONDUCTOR DEVICE HAVING HEMISPHERICAL GRAINS (HSG)

[75] Inventor: Hirohito Watanabe, Tokyo, Japan

[73] Assignee: NEC Corporation, Tokyo, Japan

[21] Appl. No.: 09/118,931

[22] Filed: Jul. 20, 1998

[30] Foreign Application Priority Data

Jul. 18, 1997 [JP] Japan ................................. 9-194423

[51] Int. Cl.⁷ .................................................. H01L 21/20
[52] U.S. Cl. ........................ 438/398; 438/238; 438/239; 438/255; 438/444; 438/488
[58] Field of Search ................................. 438/238, 239, 438/255, 444, 488, 398

[56] References Cited

U.S. PATENT DOCUMENTS

| | | | |
|---|---|---|---|
| 3,607,054 | 9/1971 | Conrad ..................................... | 23/208 |
| 4,389,273 | 6/1983 | Bloem et al. ........................... | 156/605 |
| 5,618,747 | 4/1997 | Lou ......................................... | 438/398 |
| 5,747,377 | 5/1998 | Wu .......................................... | 438/444 |
| 5,854,095 | 12/1998 | Kang et al. ............................. | 438/255 |
| 5,858,837 | 1/1999 | Sakoh et al. ............................ | 438/255 |
| 5,909,625 | 6/1999 | Lim ......................................... | 438/398 |
| 5,910,019 | 6/1999 | Watanabe et al. ...................... | 438/488 |

FOREIGN PATENT DOCUMENTS

| | | |
|---|---|---|
| 3-272165 | 3/1991 | Japan . |
| 3-263370 | 11/1991 | Japan . |
| 8-97159 | 12/1996 | Japan . |

OTHER PUBLICATIONS

Watanabe, et al. "Device application and structure observation for hemispherical–grained Si" *Journal of Applied Physics*, vol. 71, n. 7, pp. 3538–3543 (1992).

*Primary Examiner*—John F. Niebling
*Assistant Examiner*—Viktor Simkovic
*Attorney, Agent, or Firm*—Foley & Lardner

[57] ABSTRACT

Ingredient gas is first supplied into a reacting section disposed in an apparatus for chemical vapor deposition. Subsequently, a silicon film is deposited on a wafer under a condition that temperature at the upstream side of a direction of the ingredient gas flow inside the reacting section is higher than that at the downstream side thereof.

12 Claims, 5 Drawing Sheets

PROCESS FOR PRODUCING A SEMICONDUCTOR DEVICE HAVING HEMISPHERICAL GRAINS (HSG)

BACKGROUND OF THE INVENTION

1. Field of the Invention

The present invention relates to a process for producing a semiconductor device having HSGs suitable for an electrode of a capacitor, and in particular to a process for producing a semiconductor device having HSGs wherein variation in the size of the HSGs is restrained.

2. Description of the Related Art

Recently, in semiconductor devices such as a semiconductor memory, for example, dynamic RAM (DRAM), a far higher integration degree has been required than in the past. In order to respond to this requirement, areas necessary for respective memory cells have been remarkably reduced. For example, in the case of 1 M DRAM or 4M DRAM, such a design rule is adopted that a minimum design width will be 0.8 $\mu$m. In the case of 16 M DRAM, such a design rule is adopted that a minimum design width will be 0.6 $\mu$m or less. On the contrary, when the areas for the memory cells are reduced, the quantity of charges which can be accumulated in the memory cells is also reduced. Thus, as the integration degree becomes higher, it becomes more difficult to ensure the quantity of charges necessary for the memory cells.

For this reason, memory cells having a trenched or stacked capacitor are proposed and made practicable to ensure the quantity of charges necessary for the memory cells.

Resistance to soft errors of the memory cell having a stack-type capacitor is higher than that of the memory cell having a trench-type capacitor. The memory cell having a stack-type capacitor has a structure which provides less damages to a silicon substrate than the memory cell having a trench-type capacitor. Thus, the memory cell having a stack-type capacitor is expected as a memory cell in the future.

By making the trench-type capacitor into a stack-type-trenched structure, improvement in resistance to $\alpha$-rays of the trench has been investigated. Therefore, the stack-type memory cell is promising as a next generation technique.

As stack-type capacitors which can be applied to DRAM having a capacitance of 64 M or more, ones using hemispherical-grain (HSG) technique has been proposed. In the HSG technique, many hemispherical grains or mushroom-like grains are formed on the surface of accumulating electrodes of the capacitor so that the surface area of the accumulating electrodes is substantially enlarged. Thus, a large capacitance can be ensured.

For example, Japanese Patent Application Laid-Open No. 3-272165 discloses a process for producing an accumulating electrode having hemispherical grains. In this prior art, hemispherical grains are formed at a temperature where a silicon film is transited from an amorphous state to a polycrystal state, in the step of growing the silicon film by LPCVD. This silicon film is applied to the lower electrode of a stack-type capacitor. Thus, the surface area of the electrode is remarkably enlarged so that the quantity of accumulated charges is increased.

Japanese Patent Application Laid-Open No. 3-263370 states that in the step of growing a silicon film by LPCVD the surface area of an electrode, which has a surface whose rough state is unclear, increases at a temperature where the silicon film is transited from an amorphous state to a polycrystal state.

An article published thereafter "Device application and structure observation for hemispherical grained Si" Journal of Applied Physics, Vol. 71, No 7, pp. 3538–3543, 1992 by Watanabe et al. made the growing mechanism of hemispherical or mushroom-like grains evident.

According to this article, grains constituting roughness of the Si surface are not formed in the step of growing the silicon film by CVD, but are formed as follows. Crystal nuclei are thermally formed in an annealing step immediately after the silicon film is grown, and then silicon atoms migrating on the Si surface are captured by the crystal nuclei so that the grains constituting roughness of the Si surface are formed.

These publication and article state that in order to form roughness on the surface of the electrode it is important to control temperature into a very narrow temperature range within which amorphous silicon is transited into polycrystal silicon.

The prior art process for producing a stack-type capacitor wherein the surface of its electrode has roughness will be described. An interlayer insulation film is first formed on a semiconductor substrate having semiconductor elements such as MOSFET. At a given position of this interlayer insulation film a contact hole is formed and then a silicon film which will finally electrically connected to semiconductor elements through the contact hole is deposited. Subsequently, this silicon film is patterned to form a lower electrode. At this time, roughness is produced on the surface of the lower electrode by, e.g., the aforementioned prior art. After that, a capacitive insulator film and an upper electrode are formed successively to obtain a stack-type capacitor.

As described above, it is reported that hemispherical or mushroom-like grains, which constitute roughness, can be formed within a very narrow transiting temperature range where the deposited silicon film is transited from an amorphous state to a polycrystal state.

However, when the temperature inside a furnace is accurately set into the temperature at which amorphous silicon is transited to polycrystal silicon, which is described in Japanese Patent Application Laid-Open No. 3-272165 and then roughness is attempted to be formed on the surfaces of many wafers at a time by using LPCVD apparatus, a problem is caused that properties of devices are varied dependently on the respective positions of the wafers inside the furnace.

When an LPCVD apparatus for batch process having a normal furnace tube is used to deposit a silicon film, the temperature at the downstream side of ingredient gas flow is generally higher than that at the upstream side of the ingredient gas flow in order to improve uniformity of the silicon film thickness inside the furnace.

This is because, in the film depositing apparatus for batch process, film-forming ingredient gas is consumed to form a film when the gas flows in the furnace, and consequently the concentration of the ingredient gas drops at the downstream side of the gas flow. In other words, if the temperature inside the reaction furnace is made uniform, the thickness of the film at the upstream side of the gas flow becomes larger than that of the film at the downstream side because of difference in the concentration of the ingredient gas. Thus, the temperature at the downstream side of the gas flow, at which the concentration of the ingredient gas is liable to be low, is raised so that film-forming efficiency is improved at the downstream side to make the thickness of the film uniform.

However, when the temperature at the downstream side of the ingredient gas flow is set to a somewhat higher value than that at the upstream side in the process of forming roughness on the surfaces of many wafers at a time, the uniformity of the film thickness is improved but the uniformity of the roughness is deteriorated to a considerably degree.

When the temperature inside a furnace is made uniform and an LPCVD apparatus is used so as to form HSGs in a great number of wafers in such a manner as above, a size, a density and a shape of the grains are varied dependently on the respective positions of the wafers inside the furnace. The difference in the surface shape of the wafers causes the quantity of charges which are to be accumulated in capacitors to be varied dependently on the respective positions of the wafers inside the furnace when they are treated in the LPCVD apparatus. Furthermore, when the temperature at the downstream side of the ingredient gas flow is higher than that at the upstream side thereof, the uniformity of the film thickness is improved but the state of the formed roughness is deteriorated. In short, in the prior art process for producing a semiconductor device it is very difficult to form roughness having a uniform shape independent on the positions of wafers inside a furnace on the surface of a silicon film.

SUMMARY OF THE INVENTION

An object of the present invention is to provide a process for producing a semiconductor device having HSGs which makes it possible to form uniform HSGs on every wafer independently on the positions of the wafers inside a CVD apparatus even if a large number of silicon films having HSGs for use as a lower electrode of a stack-type capacitor are produced at a time.

The process for producing a semiconductor device having HSGs according to the present invention comprises the steps of: supplying ingredient gas into a reacting section disposed in an apparatus for chemical vapor deposition; and depositing a silicon film on a wafer under a condition that temperature at the upstream side of a direction of the ingredient gas flow inside the reacting section is higher than that at the downstream side of the direction.

In the present invention, the silicon film is deposited on wafer under the condition that the temperature at the upstream side of the ingredient gas flow is higher than that at the downstream side thereof. Thus, even if the plural wafers are present inside the reacting section, uniform HSGs can be formed at the silicon film of each of the wafers.

DETAILED DESCRIPTION OF THE PREFERRED EMBODIMENTS

Embodiments according to the present invention will be described in detail, referring to the attached drawings.

Figure 1:
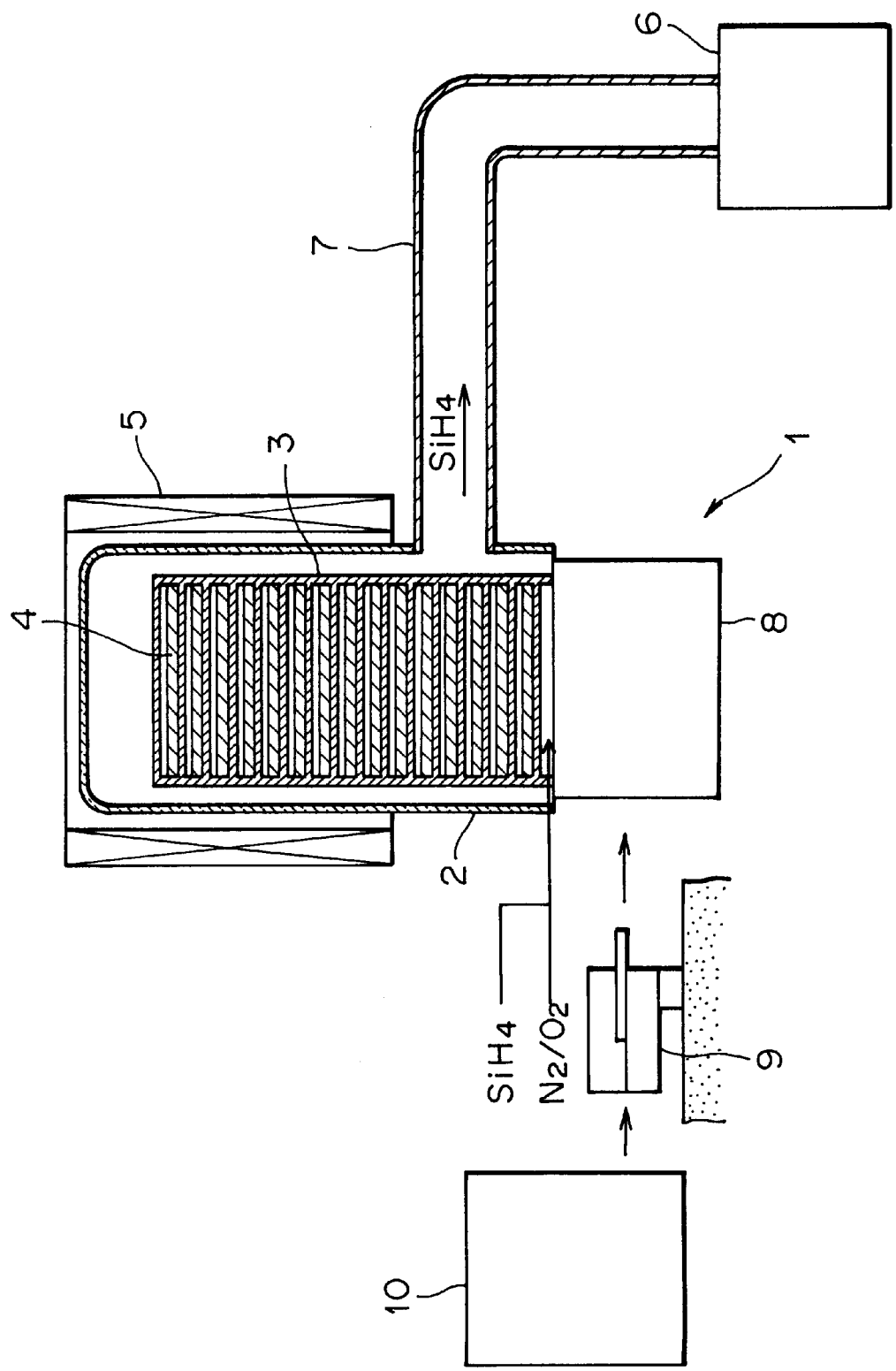
FIG. 1 is a schematic view illustrating a vertical LPCVD apparatus used in the process for producing a semiconductor device having HSGs according to the first embodiment of the present invention.

FIG. 1 is a schematic view illustrating a vertical LPCVD apparatus used in the process for producing a semiconductor device having HSGs according to the first embodiment of the present invention. The vertical LPCVD apparatus 1 used in the first embodiment is equipped with a vertical reacting section 2 wherein deposition of a silicon film is carried out. A setting stand 8 is disposed under the reacting section 2. A wafer-laying boat 3 is arranged on the setting stand 8. Wafers 4 are laid on the boat 3. Heaters 5 are located around the reacting section 2. The reacting section 2 is furnished with a gas introducing opening so that reactant gases ($SiH_4$ and $N_2/O_2$) can be introduced from the lower points of the wafers 4 into the reacting section 2. The reacting section 2 also has at the lower portion a gas discharging pipe 7. To this gas discharging pipe 7, a dry pump 6 is connected. $SiH_4$ gas, among the reactant gases, is an ingredient gas for a silicon film.

In the vertical LPCVD apparatus 1 having such a structure as above, the boat 3 on which the wafers 4 are laid is introduced inside the reacting section 2 from its bottom by means of the setting stand 8. The reacting section 2 is evacuated with the dry pump 6, and then the reactant gases are supplied into the reacting section 2 through the gas introducing opening. At that time, the reacting section 2 is heated with the heater 5. After finishing the formation of a film, the boat 3 on which the wafers 4 are laid is taken off from the reacting section 2 by means of the setting stand 8.

A cassette 10 inside which a plurality of wafers to be processed are received is arranged outside the vertical LPCVD apparatus 1, and a wafer carrying robot 9 is used to carry the wafers 4 between the cassette 10 and the vertical LPCVD apparatus 1. The wafers 4 are laid on the boat 3 by the wafer carrying robot 9.

At first the progress resulting in completion of the first embodiment will be described.

The inventor investigated on the formation of hemispherical or mushroom-like grain(s) (which is/are referred to as an HSG or HSGs, hereinafter).

Using the vertical LPCVD apparatus 1, a second silicon film was formed on a first polycrystal silicon film doped with phosphorus of the wafer 4 at the temperature where amorphous silicon was transited to polycrystal silicon. Namely, this condition was the same as in the process disclosed in Japanese Patent Application Laid-Open No. 3-272165. The temperature inside the reacting section 2 at this time was 590° C., according to measurement with an inner thermocouple. On the contrary, the temperature outside the reacting section 2 was 550° C. according to measurement with an outer thermocouple. An accidental error in the temperature distribution inside the reacting section 2 was ±1° C. The flow of silane gas ($SiH_4$), which was an ingredient gas, was 500 sccm. The pressure for introducing this gas was 1 Torr. The thickness of the second silicon film thus deposited on the first silicon film was 1000 Å. The wafers 4 were subjected to annealing for 14 minutes.

Subsequently, a thermal nitriding process, nitrided film CVD-growing process and nitrided film oxidizing process were used so that a capacitive insulator film was formed on the second silicon film, and then the third polycrystal silicon film, which would become an upper electrode, was deposited on the capacitive insulator film.

Dopants were diffused into the second silicon film, in annealing treatment in the process for producing the capacitive insulator film, by the process wherein dopants were thermally diffused from the first polycrystal silicon film doped with phosphorus under the second silicon film into the second silicon film.

Before deposition of the second silicon film, the boat 3 on which the wafers 4 were laid was raised up into the heated reacting section 2 and then kept as it was, for 40 minutes, so that the temperature around the wafers would be stabilized. This caused the temperature of the wafers 4 to be substantially equal to the temperature inside the reacting section 2.

Observation of the wafers 4 after the second silicon film was formed thereon demonstrated that HSGs were formed on the surface of the wafers 4. Therefore, by applying the second silicon film to the lower electrode of a stack-type capacitor, the surface area of the electrode increases to a large degree so that the quantity of accumulated charges will also increase. However, the shape and density of the HSGs were remarkably varied dependently on the respective positions of the wafers inside the reacting section 2.

Specifically, HSGs having a size of about 600 Å were densely formed on the surface of the wafers 4 laid on the upper portion of the boats 3 (at the downstream side of the gas flow). HSGs having a size of about 700 Å were densely formed on the surface of the wafers 4 laid on the vicinity of the middle portion of the boat 3. On the contrary, the density of HSGs formed on the surface of the wafers 4 laid on the lower portion of the boat 3 (at the upstream side of the gas flow) was about a half of that of the wafers 4 near the middle portion of the boat 3. Flat portions also existed between the grains. The size of the HSGs formed in the wafers 4 arranged at this position was about 400 Å, and was smaller than that of the HSGs formed in the wafers 4 arranged at the other positions. Such variation in the size of the HSGs results in influencing the characteristics of the devices.

Thus, the inventor investigated alteration of the temperature inside the reacting section 2, in order to find out a method for amending the inequality of the size of the HSGs dependent on the positions thereof inside the reacting section 2.

As described above, in LPCVD process, the temperature at the downstream of gas flow is in general made higher than that at the upstream side of the gas flow so as to make the thickness of a formed film equal in general, for the following reason. As the position of the wafer is nearer to the downstream point of the ingredient gas flow, the amount of the gas already consumed becomes larger so that the gas concentration will decrease. In prior art, the temperature at the downstream of the gas flow is heightened to compensate for the decrease in the gas concentration.

Figure 2A:
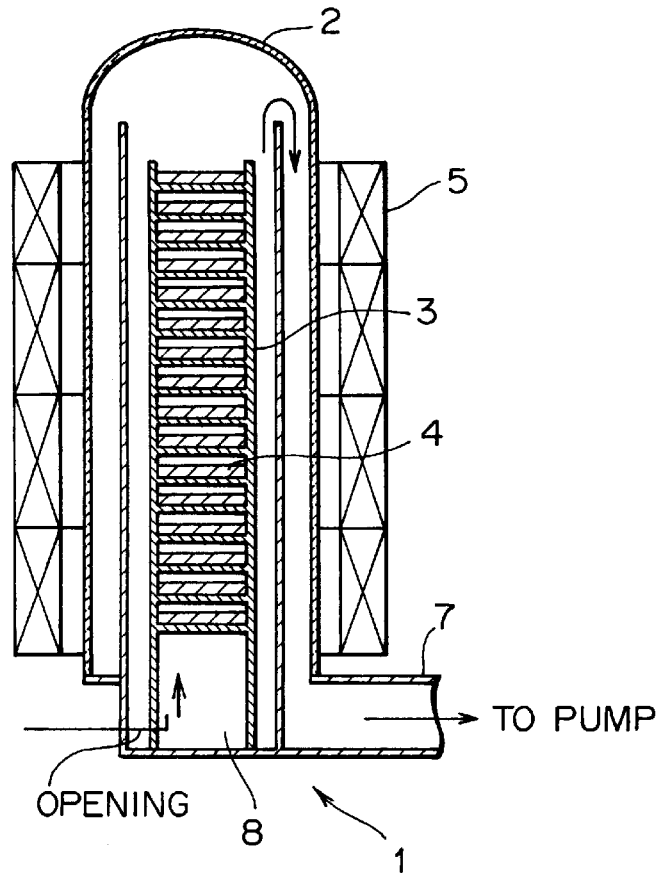
FIG. 2A is a schematic view illustrating a vertical LPCVD apparatus.
Figure 2B:
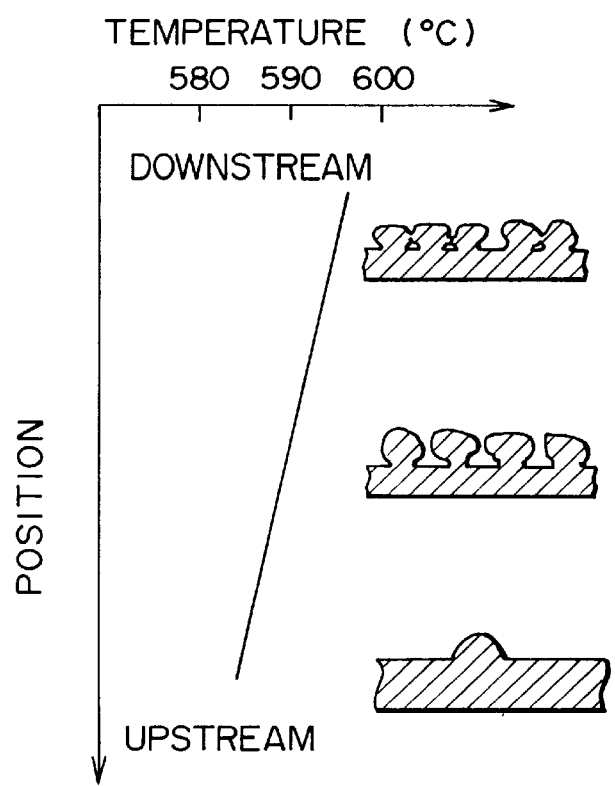
FIG. 2B is a schematic view illustrating temperature distribution and the shape of the second silicon film.

FIG. 2A is a schematic view illustrating a vertical LPCVD apparatus, and FIG. 2B is a schematic view illustrating temperature distribution and the shape of the second silicon film. The inventor set a temperature gradient as shown in FIG. 2B and formed a silicon film having HSGs. The same condition as in the above-mentioned experiment was used except that the temperature distribution inside the reacting section 2 was alternated.

The wafer 4 on which the second silicon film was deposited was observed and consequently the shape and the density of the HSGs were notably varied dependently on the respective positions of the wafers 4 inside the reacting section 2.

Specifically, as shown in FIG. 2B, HSGs wherein several grains were jointed to each other were densely formed on the surface of the wafers 4 arranged at the upper portion of the boat 3 (at the downstream side of the gas flow). HSGs having a size of about 700 Å were densely formed near the middle portion of the boat 3. On the contrary, HSGs were very thinly formed on the wafers 4 arranged at the lower portion of the boat 3 (at the upstream side of the gas flow). The thickness of the deposited silicon films was substantially uniform regardless of the positions inside the boat 3.

Figure 3A:
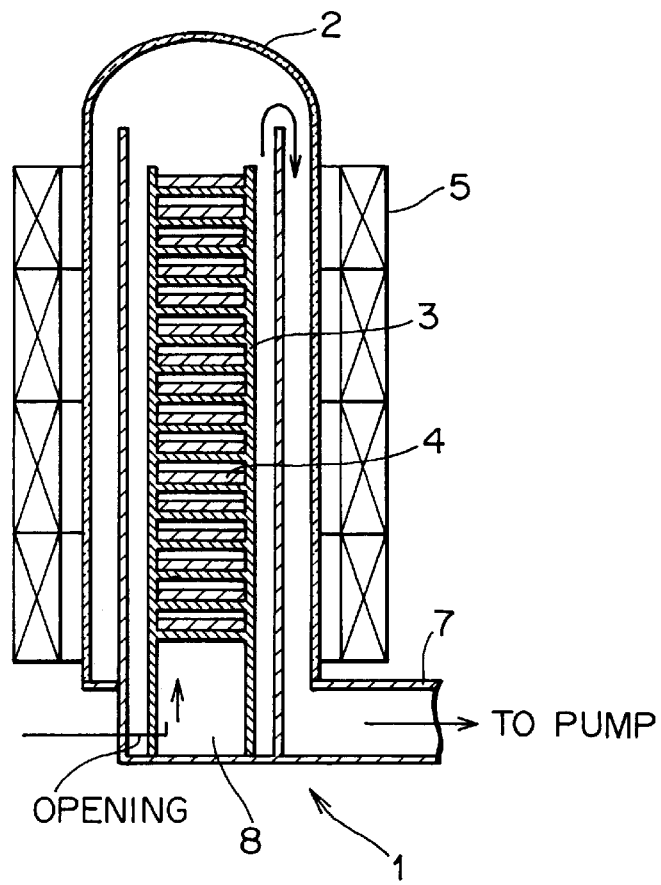
FIG. 3A is a schematic view illustrating a vertical LPCVD apparatus.
Figure 3B:
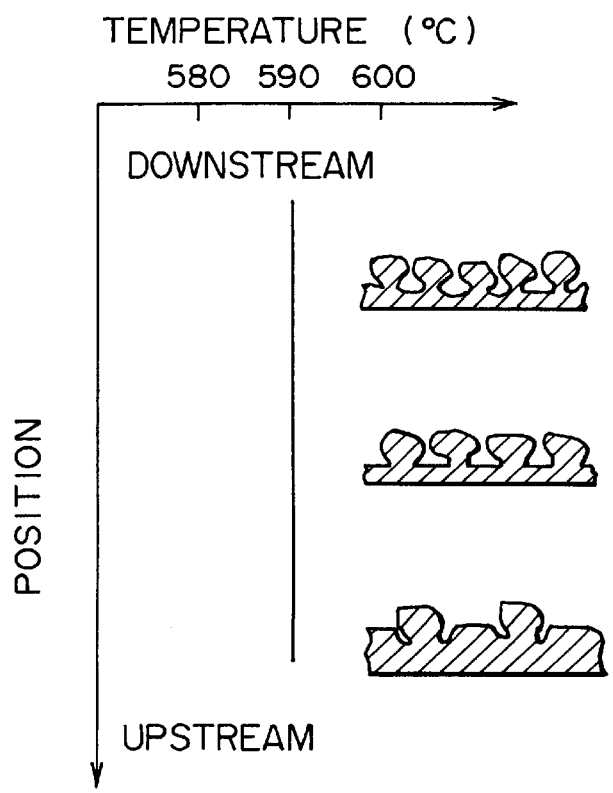
FIG. 3B is a schematic view illustrating temperature distribution and the shape of the second silicon film.

The inventors analyzed the second silicon film to investigate this reason. FIG. 3A is a schematic view illustrating a vertical LPCVD apparatus, and FIG. 3B is a schematic view illustrating temperature distribution and the shape of the second silicon film. In this investigation, the second silicon film formed at the temperature which was uniform inside the reacting section 2 as shown in FIG. 3B was analyzed. The inventor found out that the concentration of hydrogen in the silicon films was largely varied dependently on the positions on which the wafers 4 were laid. For analyzing the silicon films, TDS (Thermal Desorption Analysis) was adopted, wherein the silicon film was heated in vacuum and then gas desorbed from the film was analyzed. As a result, the silicon film formed at the upstream side of the gas flow contained hydrogen in an amount of about 1.3 times the amount in the silicon film formed at the downstream side thereof. When influence of hydrogen on the formation of HSGs was investigated, it was found out that the existence of hydrogen caused restraint of migration of silicon atoms.

This is because thermal desorption of hydrogen permits silicon atoms from which hydrogen bonded to thermally-desorbed hydrogen to be migrated. In short, restraint of migration of silicon atoms on the silicon film by existence of hydrogen is related to restraint of formation of crystal nuclei on the surface of the silicon film and growth of the crystal grains.

Furthermore, the inventor investigated a cause that concentration of hydrogen on the surface of the silicon films and in the silicon film was varied dependently on their positions inside the reacting section 2. As a result, it was found out that the amount of thermally decomposed silane ($SiH_4$) gas was less at the upstream side of the gas flow than at the downstream side thereof because the gas at the upstream side fell in a state immediately after being heated. This is because at the downstream side of the gas flow silane gas is heated with the heater 5 around the reacting section 2 for a longer time and consequently silane molecules changed into such a form that hydrogen is liable to be desorbed from the molecules increase. It is considered that the difference in the quantity of hydrogen contained in the ingredient gas is observed as the difference in the quantity of hydrogen in the silicon film. The aforementioned cause may be that, depending on the position inside the reacting section 2, the period when the ingredient gas stays at the position is different, in the light of the structure of the apparatus, which is not evident.

As described above, the difference in the concentration of hydrogen may have an influence on the formation of HSGs. This is a possibility and is not conclusive.

Figure 4A:
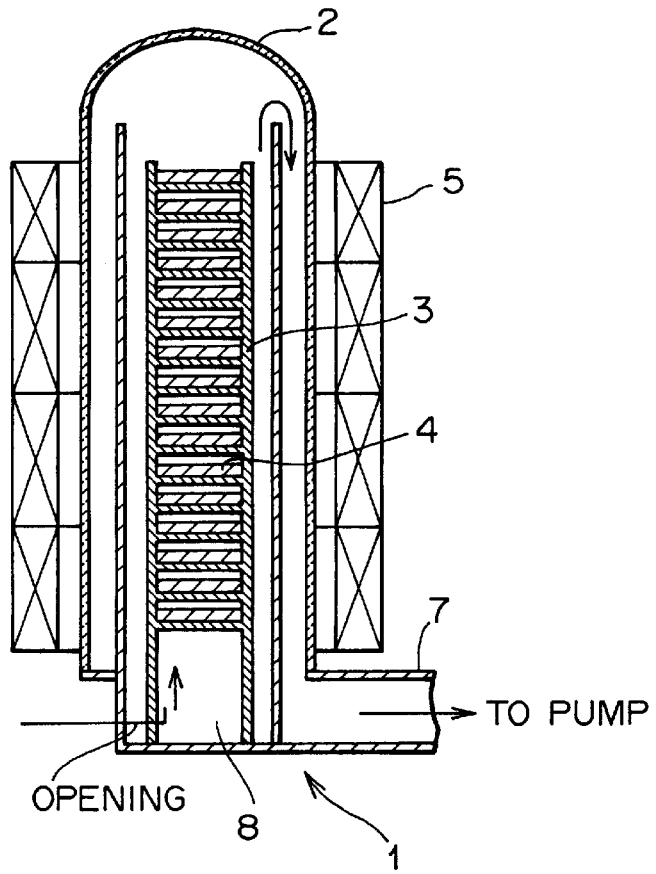
FIG. 4A is a schematic view illustrating a vertical LPCVD apparatus.
Figure 4B:
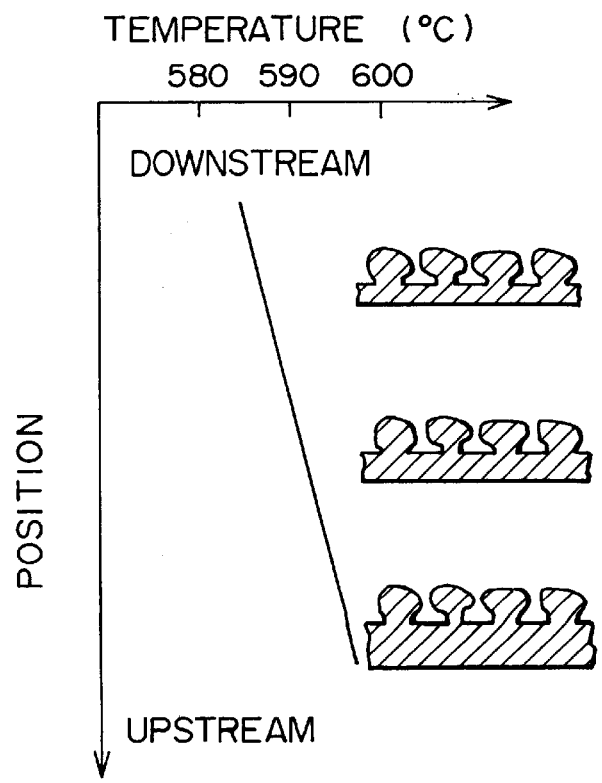
FIG. 4B is a schematic view illustrating temperature distribution and the shape of the second silicon film.

In the light of the above, in the first embodiment of the present invention, the temperature at the upstream side of the gas flow, where the hydrogen content is high, is set to a higher value than that at the downstream side thereof, and then the second silicon film is formed. FIG. 4A is a schematic view illustrating a vertical LPCVD apparatus, and FIG. 4B is a schematic view illustrating temperature distribution and the shape of the second silicon film. Specifically, temperature gradient is set as shown in FIG. 4B. Namely, the temperature at the upstream side of the gas flow (at the lower side of the boat 3) is set to a higher value than that at the downstream side thereof (at the upper side of the boat 3). The former is about 596° C. and the latter is about 585° C. In this case the same condition as in the aforementioned experiment is used except that the temperature distribution inside the reacting section 2 is altered.

In the present embodiment, the temperature inside the reacting section 2 is set appropriately so that the size of HSGs does not depend on the position where the wafer is laid. Thus, as shown in FIG. 4B, HSGs having a uniform size are formed on the respective wafers 4, at a time. For example, HSGs having a size of about 700 Å are densely formed on the whole surfaces of all wafers 4. However, by setting the temperature at the upstream side to a higher value than that at the downstream side, the thickness of the silicon film at the upper side of the boat 3 may be smaller than that of the silicon film at the lower side of the boat 3.

Figure 5:
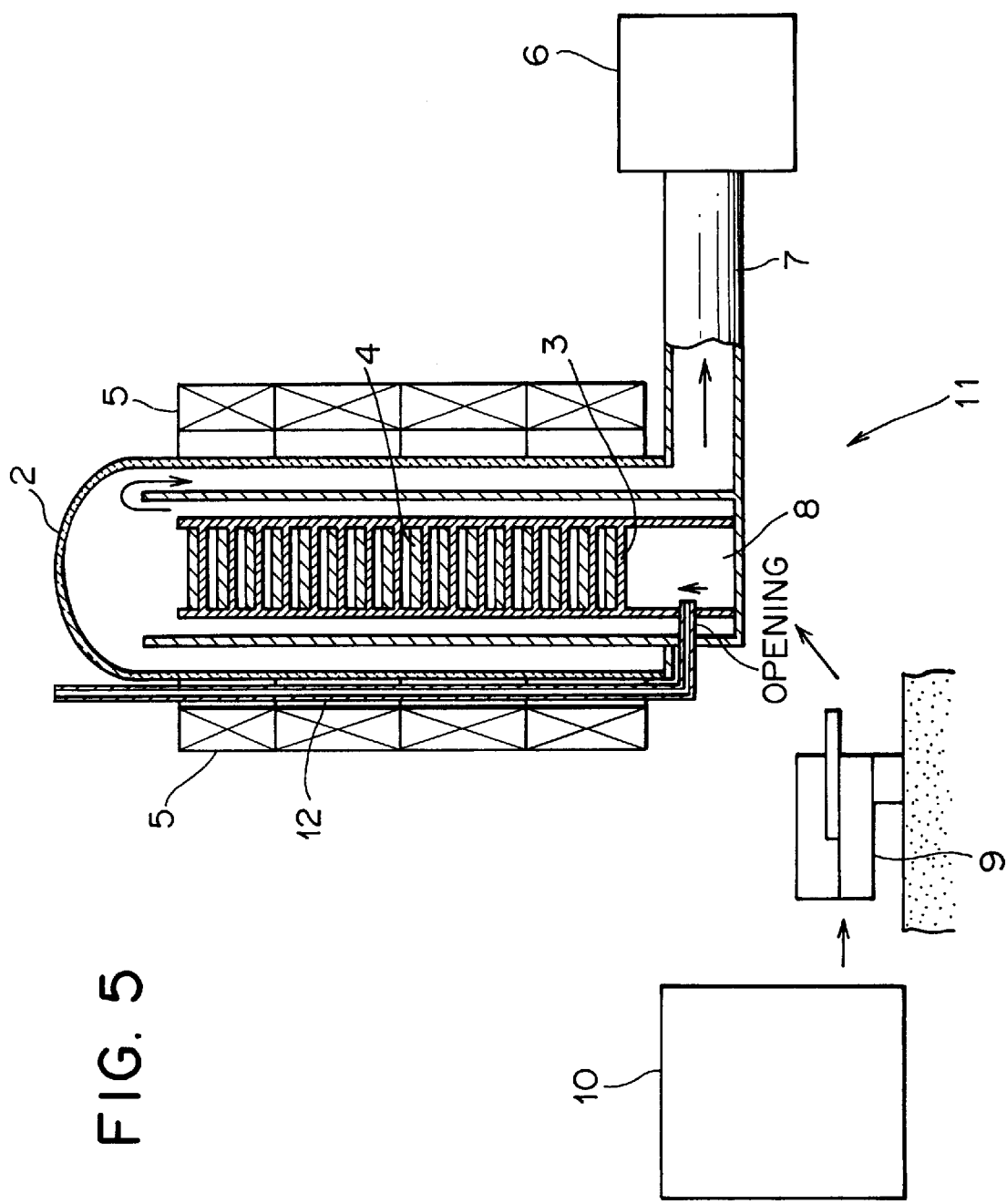
FIG. 5 is a schematic view illustrating a vertical LPCVD apparatus used in the process for producing a semiconductor device having HSGs according to the second embodiment of the present invention.

The following will describe the second embodiment of the present invention. FIG. 5 is a schematic view illustrating a vertical LPCVD apparatus used in the process for producing a semiconductor device having HSGs according to the second embodiment of the present invention. In the apparatus shown in FIG. 5, the same reference numbers are attached to the same elements as in the apparatus shown in FIG. 1, and detailed explanation of the elements is omitted. The vertical LPCVD apparatus 11 used in the second embodiment is equipped with a gas heating section 12 for heating reactant gas ($SiH_4$ and $N_2/O_2$) to a temperature as high as the temperature inside the reacting section 2 with the heater 5. The reactant gas is heated in the gas heating section 12 and then is supplied from the lower side of the reacting section 2 to the upper side thereof, so as to be discharged from the lower side of the reacting section 2 with a dry pump 6.

The progress resulting in completion of the second embodiment will be described.

The inventor used the vertical LPCVD apparatus 11 to set the temperature inside the reacting section 2 to 590° C. At this time, an accidental error in the temperature distribution inside the reacting section 2 was within ±1° C. This temperature was the temperature at which the silicon film was transited from an amorphous state into a polycrystal state. In other words, this was the same condition as in Japanese Patent Application Laid-Open No. 3-272165.

Subsequently, silane gas was supplied into a furnace in the reacting section 2 at 500 sccm and 1 Torr to deposit a second silicon film having a thickness of 1000 Å on the first polycrystal silicon film doped with phosphorus of the wafer 4. The wafer was then subjected to annealing treatment for 14 minutes inside the reacting section 2.

After that, a thermal nitriding process, nitrided film CVD-growing process and nitrided film oxidizing process were used so that a capacitive insulator film was formed on the second silicon film, and then the third polycrystal silicon film, which would become an upper electrode, was deposited on the capacitive insulator film.

The dopant, i.e., phosphorus was diffused into the second silicon film, in annealing treatment in forming the capacitive insulator film, by thermally diffusing the dopant from the first silicon film doped with the phosphorus under the second silicon film into the second silicon film.

The wafer 4 on which the second silicon film was formed was observed. Consequently, HSGs were formed on the surface of the wafer 4. In spite of uniformity of the temperature inside the furnace of the reacting section 2, the dependency of the size and the density of HSGs on the respective positions of the wafers 4 was smaller than the case wherein the ingredient gas was not heated in advance.

Specifically, HSGs having a size of about 700 Å were densely formed on the surface of the wafers 4 arranged at the upper portion of the boat 3 (at the downstream side of the gas flow). Also, HSGs having a size of about 700 Å were densely formed on the surface of the wafers 4 arranged near the middle portion of the boat 3. On the contrary, on the surface of the wafers 4 arranged at the lower portion of the boat 3 (at the upstream side of the gas flow), HSGs having a size of about 600 Å were formed, which was somewhat small. The density thereof was about 90% of that of HSGs arranged near the middle portion of the boat 3.

In the light of the above, in the second embodiment, the temperature at the upper portion of the boat 3 is set to, for example, 2° C. lower than that at the higher portion thereof, and in this state reactant gas was heated to substantially the same temperature as that inside the reacting section 2 with the heater 5 in a gas heating section 12, and subsequently this was supplied from the lower portion of the reacting section 2 to the upper portion thereof.

According to the second embodiment of the present invention, uniform HSGs can be also formed on the whole surfaces of all wafers 4 regardless of the positions of the wafers 4 inside the reacting section 2.

What is claimed is:

1. A process for producing a semiconductor device having HSGs, comprising the steps of:

supplying ingredient gas into a reacting section disposed in an apparatus for chemical vapor deposition; and depositing a silicon film on a wafer to form HSGs thereon, said depositing taking place such that the temperature at the upstream side of a direction of said ingredient gas flow inside said reacting section is higher than that at the downstream side of said direction; and utilizing said HSGs in a capacitive structure for said semiconductor device.

2. The process for producing a semiconductor device having HSGs according to claim 1, wherein said ingredient gas comprises molecules consisting of hydrogen atoms and silicon atoms.

3. The process for producing a semiconductor device having HSGs according to claim 1, wherein a plurality of wafers are arranged along said direction of said ingredient gas flow inside said reacting section.

4. The process for producing a semiconductor device having HSGs according to claim 1, wherein said apparatus for chemical vapor deposition is a low pressure chemical vapor deposition apparatus for a batch process.

5. The process for producing a semiconductor device having HSGs according to claim 1, which further comprises the step of heating said ingredient gas to substantially the same temperature as the temperature inside said reacting section before said step of supplying said ingredient gas.

6. The process for producing a semiconductor device having HSGs according to claim 1, wherein said step of supplying said ingredient gas is a step of supplying $N_2$ and $O_2$ gases together with said ingredient gas into said reacting section.

7. The process for producing a semiconductor device having HSGs according to claim 1, wherein temperature at the upstream side of said ingredient gas flow inside said reacting section is substantially 596° C., and temperature at said downstream side of said ingredient gas flow inside said reacting section is substantially 585° C.

8. The process for producing a semiconductor device having HSGs according to claim 1, which further comprises the step of annealing said wafer after said step of depositing said silicon film.

9. The process for producing a semiconductor device having HSGs according to claim 8, in which, after said step of annealing said wafer, said step of utilizing said HSGs comprising the steps of:

forming a capacitive insulator film on said silicon film, and forming another silicon film on said capacitive insulator film.

10. The process for producing a semiconductor device having HSGs according to claim 1, wherein a thickness of said silicon film is substantially 1000 Å.

11. The process for producing a semiconductor device having HSGs according to claim 1, wherein a flow amount of said ingredient gas is substantially 500 sccm.

12. The process for producing a semiconductor device having HSGs according to claim 1, wherein a polycrystal silicon film doped with phosphorus is formed on a surface of said wafer.

* * * * *